(12) United States Patent
Tomita

(10) Patent No.: US 12,336,221 B2
(45) Date of Patent: Jun. 17, 2025

(54) SEMICONDUCTOR DEVICE

(71) Applicants: KABUSHIKI KAISHA TOSHIBA, Tokyo (JP); TOSHIBA ELECTRONIC DEVICES & STORAGE CORPORATION, Tokyo (JP)

(72) Inventor: Kouta Tomita, Nonoichi Ishikawa (JP)

(73) Assignees: Kabushiki Kaisha Toshiba, Tokyo (JP); Toshiba Electronic Devices & Storage Corporation, Tokyo (JP)

( * ) Notice: Subject to any disclaimer, the term of this patent is extended or adjusted under 35 U.S.C. 154(b) by 376 days.

(21) Appl. No.: 17/475,562

(22) Filed: Sep. 15, 2021

(65) Prior Publication Data

US 2022/0085209 A1 Mar. 17, 2022

(30) Foreign Application Priority Data

Sep. 16, 2020 (JP) .................................. 2020-155893

(51) Int. Cl.
*H10D 30/66* (2025.01)
*H10D 62/17* (2025.01)
(Continued)

(52) U.S. Cl.
CPC ......... *H10D 30/668* (2025.01); *H10D 62/393* (2025.01); *H10D 64/117* (2025.01); *H10D 64/252* (2025.01); *H10D 64/62* (2025.01)

(58) Field of Classification Search
CPC ............. H01L 29/1095; H01L 29/7813; H01L 29/41766; H01L 29/66734; H10D 30/668;
(Continued)

(56) References Cited

U.S. PATENT DOCUMENTS 6,888,196 B2  5/2005  Kobayashi
9,786,772 B2  10/2017  Enomoto
(Continued)

FOREIGN PATENT DOCUMENTS

JP  2003-318395 A  11/2003
JP  2006-140263 A  6/2006
(Continued)

OTHER PUBLICATIONS

K. Miyashita et al., "New Guidelines of Optimizing SALICIDE Structure for High Speed CMOS LSI", Extended Abstracts of the 1999 International Conference on Solid State Devices and Materials, Tokyo, 1999, pp. 134-135, 2 pages.

*Primary Examiner* — Samuel A Gebremariam
*Assistant Examiner* — Jonas T Beardsley
(74) *Attorney, Agent, or Firm* — Kim & Stewart LLP

(57) ABSTRACT

A semiconductor device includes: a first electrode; a first semiconductor layer of first conductivity type provided on the first electrode; a first semiconductor region of second conductivity type provided on the first semiconductor layer; a second semiconductor region of first conductivity type provided on the first semiconductor region; a second electrode provided in a first trench, the second electrode facing the first semiconductor region with a first insulating film interposed between the second electrode and the first semiconductor region and the first trench reaching the first semiconductor layer from above the first semiconductor region; a third electrode provided in a second trench, the third electrode facing the first semiconductor region with a second insulating film interposed between the third electrode and the first semiconductor region and the second trench reaching the first semiconductor layer from above the first semiconductor region; a fourth electrode reaching the first
(Continued)

semiconductor region from above the second semiconductor region, the fourth electrode being provided between the first trench and the second trench and between the second electrode and the third electrode and the fourth electrode containing a first conductive material; a fifth electrode provided between the fourth electrode and the first semiconductor region and between the fourth electrode and the second semiconductor region, the fifth electrode containing a second conductive material, a film thickness of the fifth electrode between the fourth electrode and the first semiconductor region in a first direction in which the first electrode and the first semiconductor layer are stacked being smaller than a film thickness of the fifth electrode between the fourth electrode and the second semiconductor region in a second direction crossing the first direction; a sixth electrode provided between the fourth electrode and the fifth electrode and the sixth electrode containing a third conductive material; and a third semiconductor region provided between the fifth electrode and the first semiconductor region in the first direction and the third semiconductor region having a higher concentration of impurities of second conductivity type than the first semiconductor region.

7 Claims, 11 Drawing Sheets

(51) Int. Cl.
*H10D 64/00* (2025.01)
*H10D 64/23* (2025.01)
*H10D 64/62* (2025.01)

(58) Field of Classification Search
CPC ... H10D 64/256; H10D 64/62; H10D 30/0295
See application file for complete search history.

(56) References Cited

U.S. PATENT DOCUMENTS

| | | | |
|---|---|---|---|
| 10,170,606 | B2 | 1/2019 | Shinsho |
| 10,522,620 | B2 | 12/2019 | Nishiguchi |
| 2003/0199156 | A1 | 10/2003 | Fujii |
| 2008/0150018 | A1* | 6/2008 | Tanabe ............. H01L 29/41766 257/330 |
| 2018/0308972 | A1* | 10/2018 | Ohse ................... H01L 21/0495 |
| 2019/0096998 | A1 | 3/2019 | Fujii et al. |
| 2023/0122519 | A1* | 4/2023 | Nagata ............. H01L 29/41741 257/771 |

FOREIGN PATENT DOCUMENTS

| | | | |
|---|---|---|---|
| JP | 4004843 B2 | 11/2007 | |
| JP | 2008-160039 A | 7/2008 | |
| JP | 2018-006648 A | 1/2018 | |
| JP | 2018-014392 A | 1/2018 | |
| JP | 2019-057682 A | 4/2019 | |
| JP | 2019-134149 A | 8/2019 | |
| JP | 6660611 B2 | 3/2020 | |
| JP | 2020-076315 | * 4/2020 | ............ C23C 14/14 |

* cited by examiner

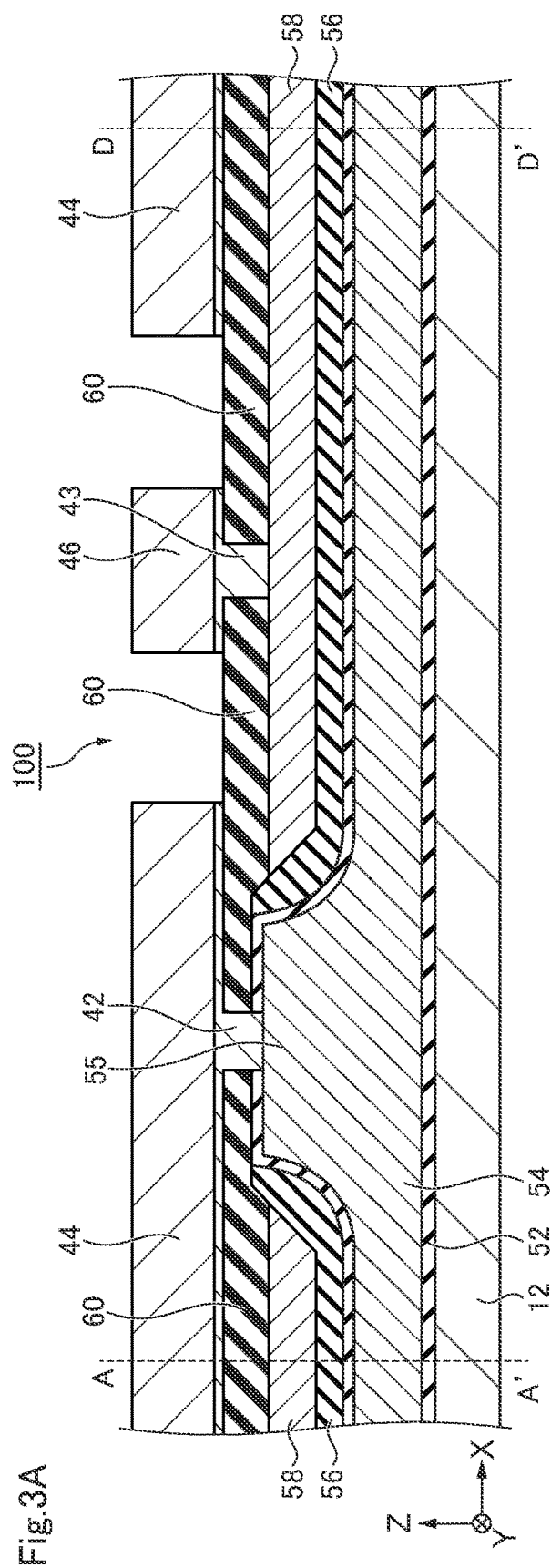
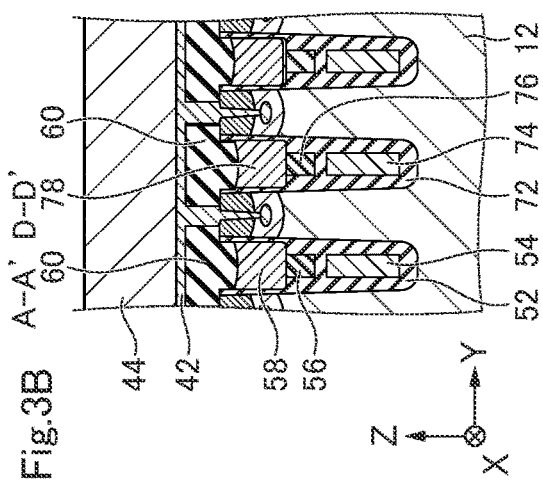

Fig.10
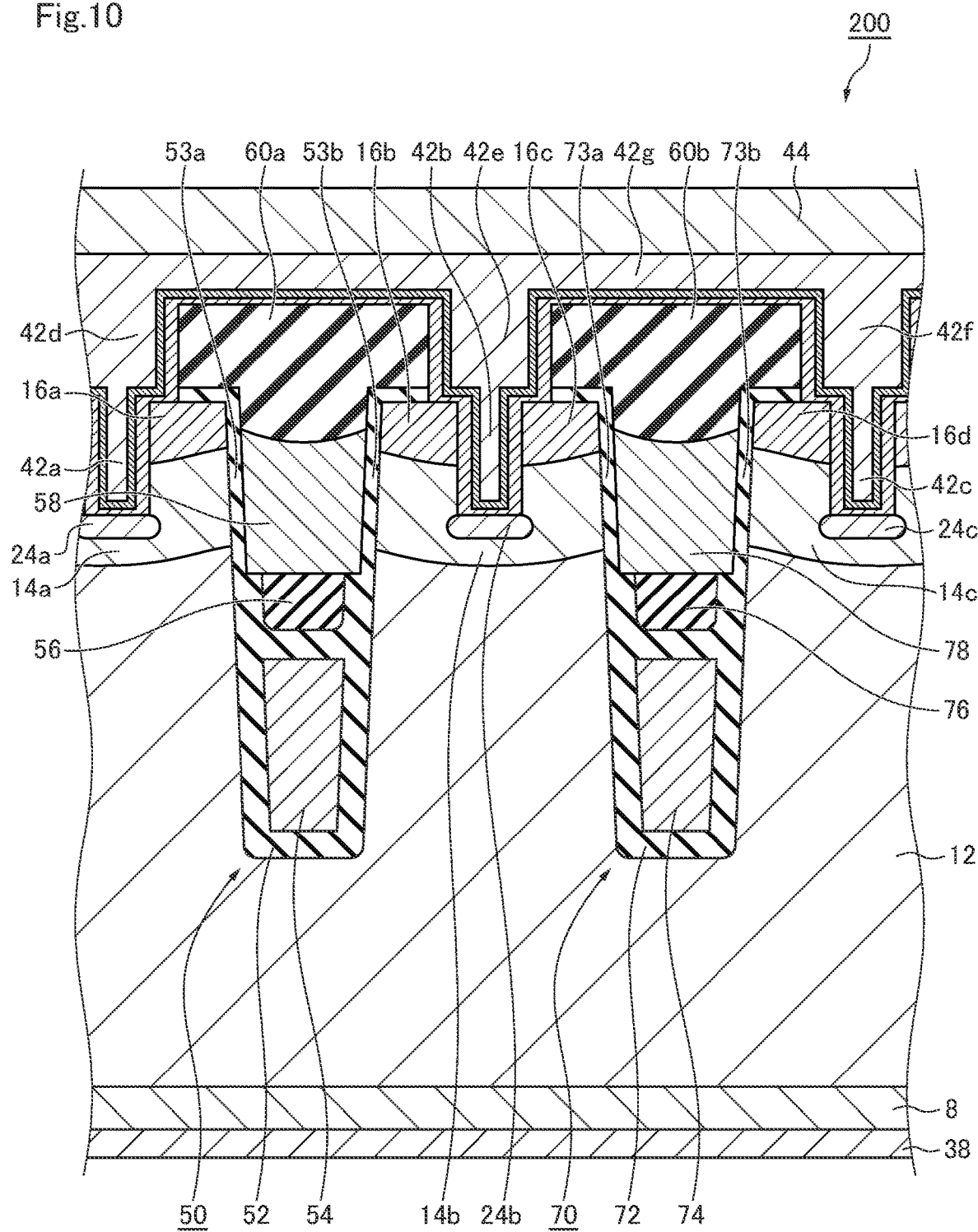
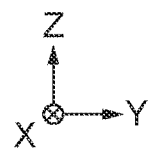

Fig.11
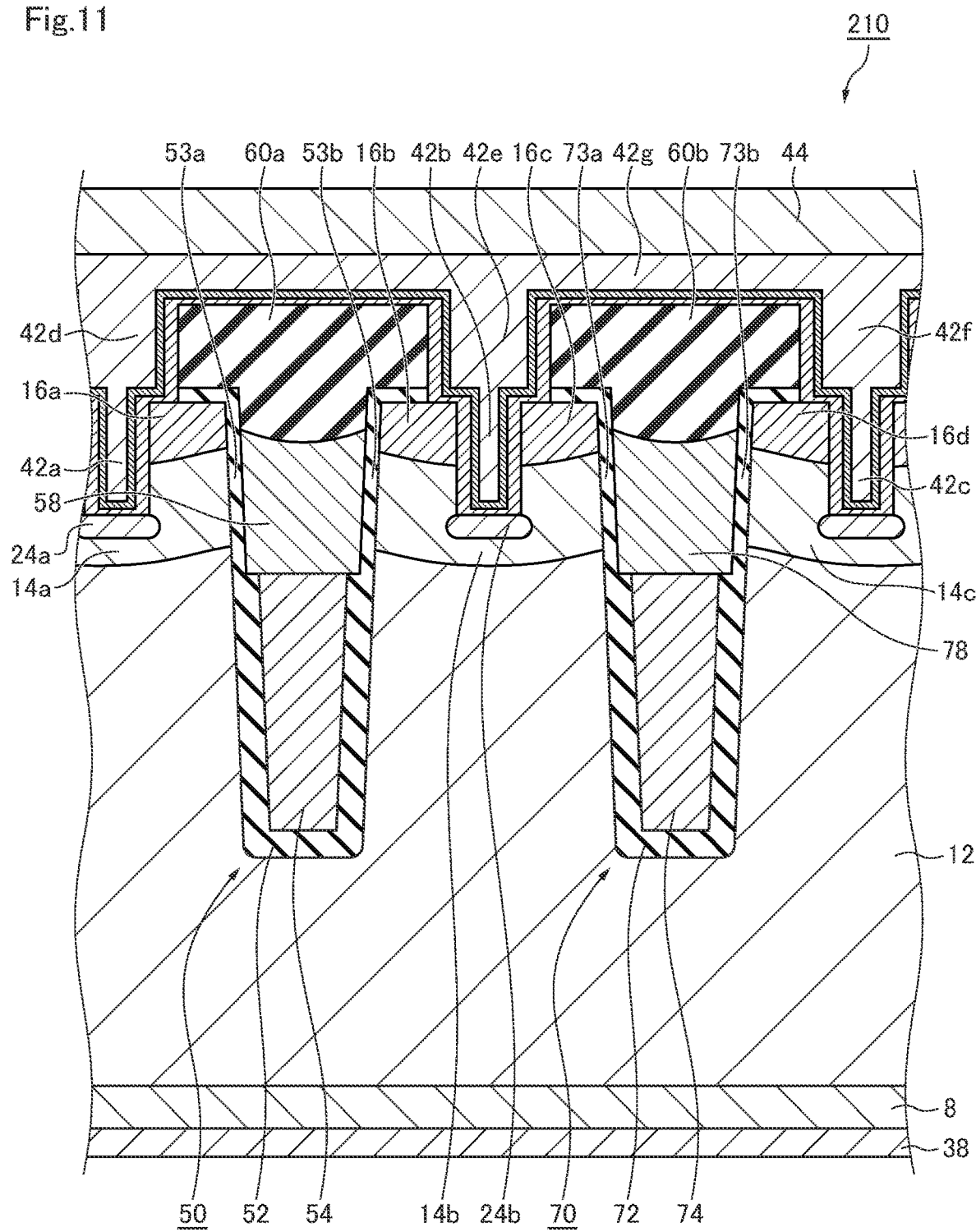
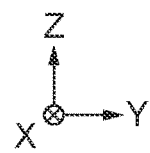

SEMICONDUCTOR DEVICE

CROSS-REFERENCE TO RELATED APPLICATION

This application is based upon and claims the benefit of priority from Japanese Patent Application No. 2020-155893, filed on Sep. 16, 2020, the entire contents of which are incorporated herein by reference.

FIELD

Embodiments described herein relate generally to a semiconductor device.

BACKGROUND

Semiconductor devices, such as a metal oxide semiconductor field effect transistor (MOSFET), are used in applications such as power conversion. For such semiconductor devices, the reduction of on-resistance or the improvement of avalanche tolerance is required.

BRIEF DESCRIPTION OF THE DRAWINGS

FIGS. 3A and 3B are schematic cross-sectional view of a main part of the semiconductor device of the first embodiment;

FIG. 10 is a schematic cross-sectional view of a semiconductor device of a second embodiment; and FIG. 11 is a schematic cross-sectional view of another aspect of the semiconductor device of the second embodiment.

DETAILED DESCRIPTION

Figure 1:
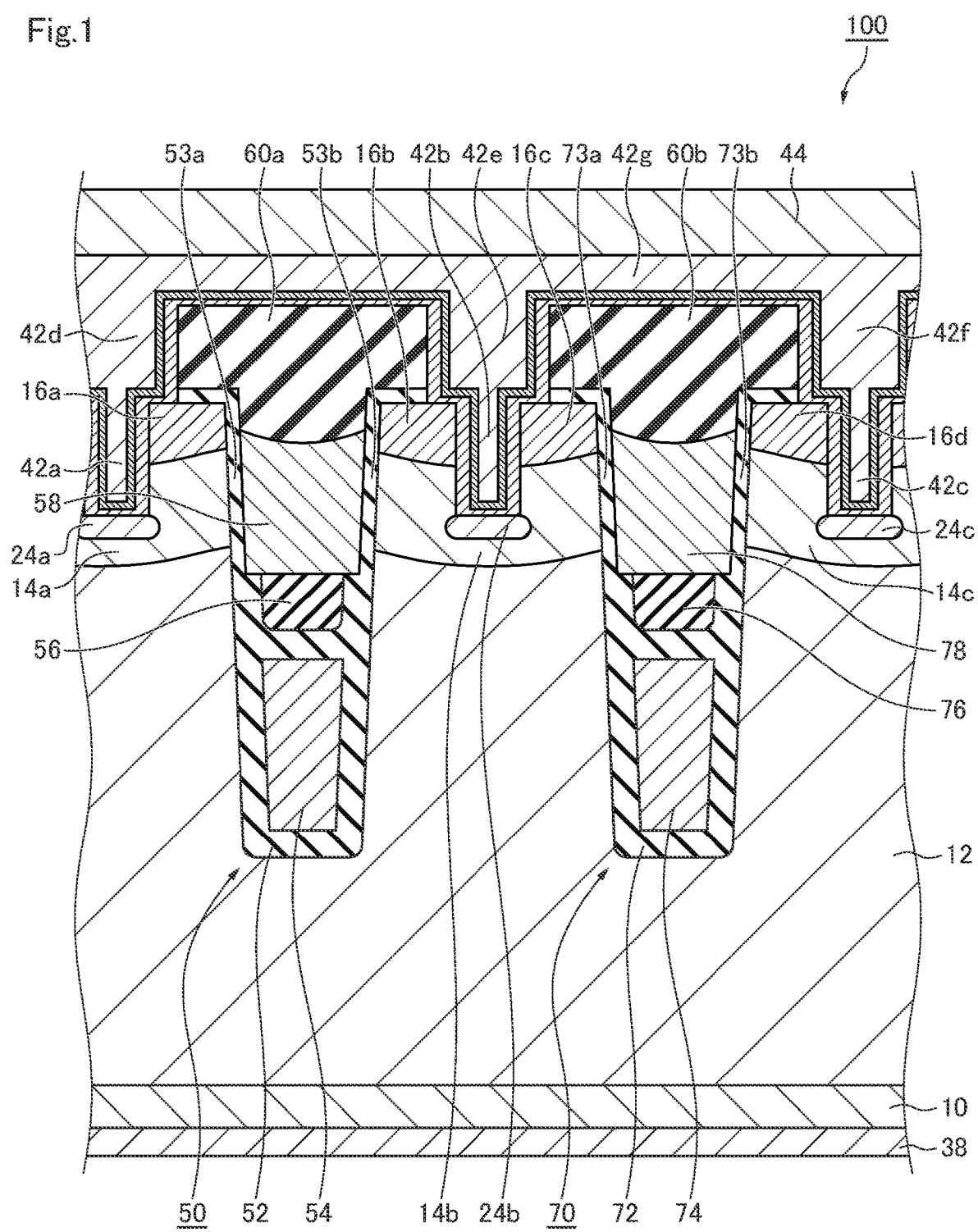
FIG. 1 is a schematic cross-sectional view of a semiconductor device of a first embodiment.

Hereinafter, embodiments will be described with reference to the diagrams. In the following description, the same members and the like are denoted by the same reference numerals, and the description of the members and the like once described will be omitted as appropriate.

In this specification, in order to show the positional relationship of components and the like, the upper direction of the diagram is described as "upper" and the lower direction of the diagram is described as "lower". In this specification, the concepts of "upper" and "lower" do not necessarily indicate the relationship with the direction of gravity.

Hereinafter, a case where the first conductivity type is n type and the second conductivity type is p type will be described as an example.

In the following description, when there are notations of $n^+$, n, $n^-$, $p^+$, p, and $p^-$, these indicate the relative high and low of the impurity concentration in each conductivity type. That is, $n^+$ indicates that the n-type impurity concentration is relatively higher than n, and v-indicates that the n-type impurity concentration is relatively lower than n. In addition, $p^+$ indicates that the p-type impurity concentration is relatively higher than p, and $p^-$ indicates that the p-type impurity concentration is relatively lower than p. In addition, $n^+$-type and $n^-$-type may be simply described as n-type, $p^+$-type and $p^-$-type may be simply described as p-type.

First Embodiment

A semiconductor device of the present embodiment includes: a first electrode; a first semiconductor layer of first conductivity type provided on the first electrode; a first semiconductor region of second conductivity type provided on the first semiconductor layer; a second semiconductor region of first conductivity type provided on the first semiconductor region; a second electrode provided in a first trench, the second electrode facing the first semiconductor region with a first insulating film interposed between the second electrode and the first semiconductor region and the first trench reaching the first semiconductor layer from above the first semiconductor region; a third electrode provided in a second trench, the third electrode facing the first semiconductor region with a second insulating film interposed between the third electrode and the first semiconductor region and the second trench reaching the first semiconductor layer from above the first semiconductor region; a fourth electrode reaching the first semiconductor region from above the second semiconductor region, the fourth electrode being provided between the first trench and the second trench and between the second electrode and the third electrode and the fourth electrode containing a first conductive material; a fifth electrode provided between the fourth electrode and the first semiconductor region and between the fourth electrode and the second semiconductor region, the fifth electrode containing a second conductive material, a film thickness of the fifth electrode between the fourth electrode and the first semiconductor region in a first direction in which the first electrode and the first semiconductor layer are stacked being smaller than a film thickness of the fifth electrode between the fourth electrode and the second semiconductor region in a second direction crossing the first direction; a sixth electrode provided between the fourth electrode and the fifth electrode and the sixth electrode containing a third conductive material; and a third semiconductor region provided between the fifth electrode and the first semiconductor region in the first direction and the third semiconductor region having a higher concentration of impurities of second conductivity type than the first semiconductor region. A semiconductor device of another aspect of the present embodiment includes: a first electrode; a first semiconductor layer of first conductivity type provided on the first electrode; a first semiconductor region of second conductivity type provided on the first semiconductor layer; a second semiconductor region of first conductivity type provided on the first semiconductor region; a second electrode provided in a first trench, the second electrode facing the first semiconductor region with a first insulating film interposed between the second electrode and the first semiconductor region and the first trench reaching the first semiconductor layer from above the first semiconductor region; a third electrode provided in a second trench, the third electrode facing the first semiconductor region with a second insulating film interposed between the third electrode and the first semiconductor region and the second trench reaching the first semiconductor layer from above the first semiconductor region; a fourth electrode reaching the first semiconductor region from above the second semiconductor region, the fourth electrode being provided between the first trench and the second trench and between the second electrode and the third electrode and the fourth electrode containing a first conductive material; a fifth electrode provided between the fourth electrode and the first semiconductor region in a second direction and between the fourth electrode and the second semiconductor region in the second direction, the first electrode and the first semiconductor layer being stacked in a first direction, the second direction crossing the first direction and the fifth electrode containing a second conductive material; a third semiconductor region provided between the fourth electrode and the first semiconductor region in the first direction and the third semiconductor region having a higher concentration of impurities of second conductivity type than the first semiconductor region; a sixth electrode provided between the third semiconductor region and the fourth electrode in the first direction and between the fourth electrode and the fifth electrode in the second direction and the sixth electrode containing a third conductive material; a seventh electrode provided between the sixth electrode and the third semiconductor region and the seventh electrode containing silicide; and an eighth electrode provided between the fifth electrode and the second semiconductor region and the eighth electrode containing silicide.

Figure 2:
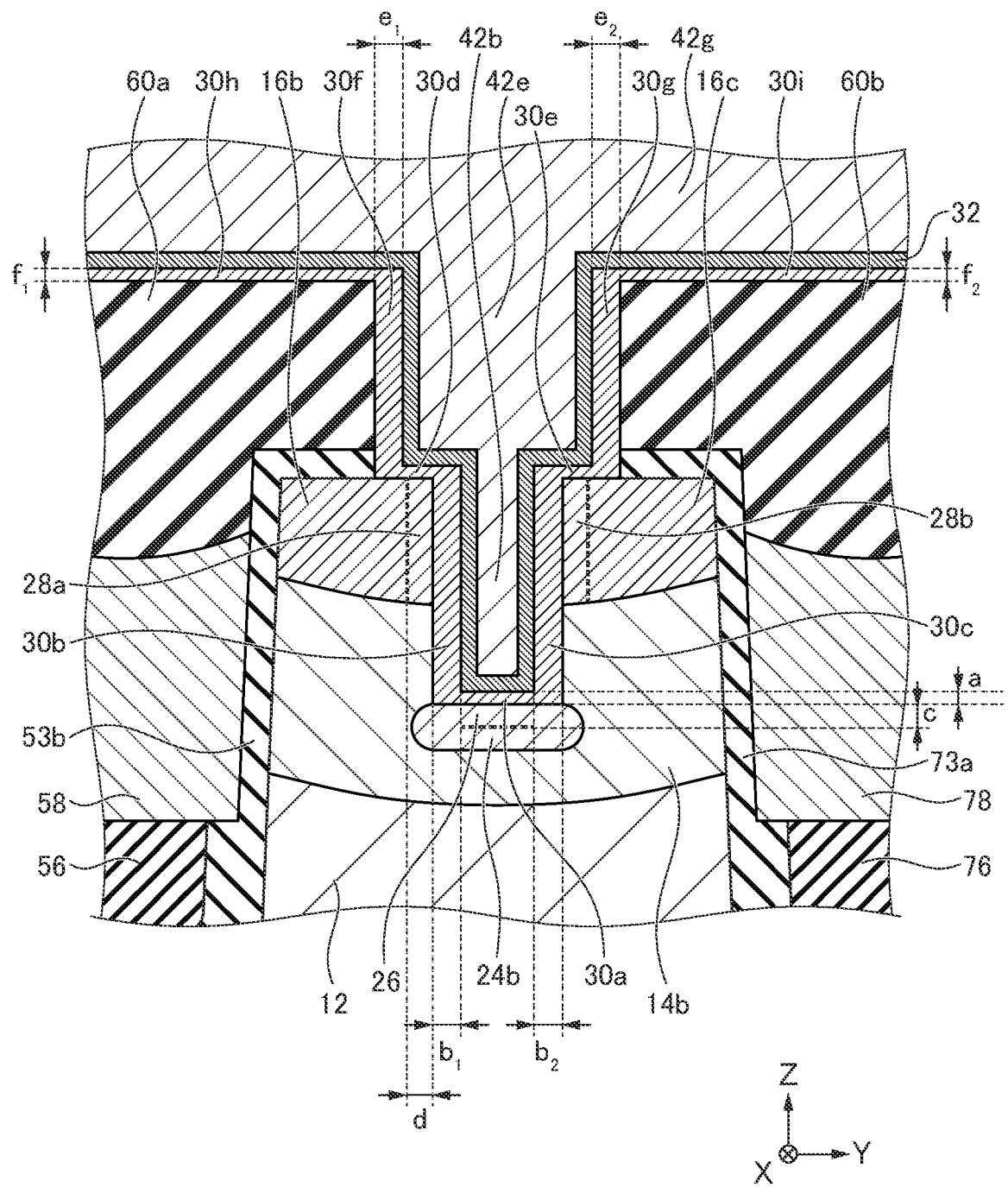
FIG. 2 is a schematic cross-sectional view of a main part of the semiconductor device of the first embodiment.

FIG. 1 is a schematic cross-sectional view of a semiconductor device 100 of the present embodiment. FIG. 2 is a schematic cross-sectional view of a main part of the semiconductor device 100 of the present embodiment. The semiconductor device 100 is, for example, a vertical MOSFET.

The semiconductor device 100 includes a drain layer 10, a drift layer 12, a base region 14, a source region 16, a p+ region 24, a first silicide portion 26, a second silicide portion 28, a contact electrode 30, a barrier metal 32, a drain electrode 38, an embedded electrode 42, a source metal 44, a first trench 50, a third insulating film 52, a first insulating film 53, a first field plate electrode 54, a fifth insulating film 56, a first gate electrode 58, an interlayer insulating portion 60, a second trench 70, a fourth insulating film 72, a second insulating film 73, a second field plate electrode 74, a sixth insulating film 76, and a second gate electrode 78.

The drain layer 10 is an example of the third semiconductor layer. The drift layer 12 is an example of the first semiconductor layer. The base region 14 is an example of the first semiconductor region. The source region 16 is an example of the second semiconductor region. The p+ region 24b is an example of the third semiconductor region. The first silicide portion 26 is an example of the seventh electrode. The second silicide portion 28 is an example of the eighth electrode. The contact electrode 30 is an example of the fifth electrode. The barrier metal 32 is an example of the sixth electrode. The drain electrode 38 is an example of the first electrode. An embedded electrode 42b and an embedded electrode 42e, which are a part of the embedded electrode 42, are examples of the fourth electrode. The first gate electrode 58 is an example of the second electrode. The second gate electrode 78 is an example of the third electrode.

The drain electrode 38 is an electrode that functions as a drain electrode of the MOSFET.

The drain layer 10 is provided on the drain electrode 38 and is electrically connected to the drain electrode 38. The drain layer 10 is a layer that functions as a drain of the MOSFET. The drain layer 10 contains, for example, an n+-type semiconductor material.

The drift layer 12 is provided on the drain layer 10. The drift layer 12 is a layer that functions as a drift layer of the MOSFET. The drift layer 12 contains, for example, an n−-type semiconductor material. The n-type impurity concentration in the drift layer 12 is lower than the n-type impurity concentration in the drain layer 10.

Here, an X direction, a Y direction perpendicular to the X direction, and a Z direction perpendicularly crossing the X and Y directions are defined. The drain layer 10 and the drift layer 12 are layers provided in parallel with the XY plane parallel to the X and Y directions. The Z direction is a direction in which the drain electrode 38 and the drain layer 10 are stacked or a direction in which the drain layer 10 and the drift layer 12 are stacked. FIG. 1 is a schematic cross-sectional view of the semiconductor device 100 in the YZ plane.

The base region 14 is provided on the drift layer 12. The base region 14 is a region that functions as a base of the MOSFET. The base region 14 is a region that forms a channel when a voltage is applied to the first gate electrode 58 or the second gate electrode 78, so that carriers can flow between the source region 16 and the drain layer 10. The base region 14 contains, for example, a p−-type semiconductor material. The semiconductor device 100 includes base regions 14a, 14b, and 14c.

The source region 16 is provided on the base region 14. The source region 16 is a region that functions as a source of the MOSFET. When an appropriate voltage is applied to the first gate electrode 58 or the second gate electrode 78, carriers flow between the source region 16 and the drain layer 10. The source region 16 contains, for example, an n+-type semiconductor material. The n-type impurity concentration in the source region 16 is higher than the n-type impurity concentration in the drift layer 12. The semiconductor device 100 includes source regions 16a, 16b, 16c, and 16d.

The first trench 50 is provided so as to reach the inside of the drift layer 12 from above the base region 14.

The second trench 70 is provided so as to reach the inside of the drift layer 12 from above the base region 14.

The first field plate electrode 54 is provided in the first trench 50 so as to face the drift layer 12 with the third insulating film 52 interposed between the first field plate electrode 54 and the drift layer 12. For example, the first field plate electrode 54 is provided to increase the breakdown voltage by promoting the spread of the depletion layer from the interface between the base region 14 and the drift layer 12 toward the drain layer 10, because a depletion layer spreads from the interface between the third insulating film 52 and the drift layer 12 to the drift layer 12 side. In addition, the first field plate electrode 54 may not be provided.

The second field plate electrode 74 is provided in the second trench 70 so as to face the drift layer 12 with the fourth insulating film 72 interposed between the second field plate electrode 74 and the drift layer 12. For example, the second field plate electrode 74 is provided to increase the breakdown voltage by promoting the spread of the depletion layer from the interface between the base region 14 and the drift layer 12 toward the drain layer 10, because a depletion layer spreads from the interface between the fourth insulating film 72 and the drift layer 12 to the drift layer 12 side. In addition, the second field plate electrode 74 may not be provided.

The third insulating film 52 is provided in the first trench 50. The third insulating film 52 functions as a field plate insulating film that insulates the first field plate electrode 54 from the drift layer 12. For example, the third insulating film 52 may be provided around the first field plate electrode 54 so as to cover the first field plate electrode 54.

The first insulating film 53 is provided on the third insulating film 52 in the first trench 50. The first insulating film 53a is provided between the base region 14a and the first gate electrode 58. The first insulating film 53b is provided between the base region 14b and the first gate electrode 58. In other words, the first gate electrode 58 is provided in the first trench 50 so as to face the base region 14a with the first insulating film 53a interposed between the first gate electrode 58 and the base region 14a. In addition, the first gate electrode 58 is provided in the first trench 50 so as to face the base region 14b with the first insulating film 53b interposed between the first gate electrode 58 and the base region 14b. The first insulating film 53 functions as a gate insulating film that insulates the first gate electrode 58 from the drift layer 12, the base region 14, and the source region 16. The thickness of the first insulating film 53a and the thickness of the first insulating film 53b are smaller than the thickness of the third insulating film 52.

The first insulating film 53 and the third insulating film 52 insulate the first field plate electrode 54 and the first gate electrode 58 from the drift layer 12, the base region 14, and the source region 16.

The fourth insulating film 72 is provided in the second trench 70. The fourth insulating film 72 functions as a field plate insulating film that insulates the second field plate electrode 74 from the drift layer 12. For example, the fourth insulating film 72 may be provided around the second field plate electrode 74 so as to cover the second field plate electrode 74.

The second insulating film 73 is provided on the fourth insulating film 72 in the second trench 70. The second insulating film 73a is provided between the base region 14b and the second gate electrode 78. The second insulating film 73b is provided between the base region 14c and the second gate electrode 78. In other words, the second gate electrode 78 is provided in the second trench 70 so as to face the base region 14b with the second insulating film 73a interposed between the second gate electrode 78 and the base region 14b. In addition, the second gate electrode 78 is provided in the second trench 70 so as to face the base region 14c with the second insulating film 73b interposed between the second gate electrode 78 and the base region 14c. The second insulating film 73 functions as a gate insulating film that insulates the second gate electrode 78 from the drift layer 12, the base region 14, and the source region 16. The thickness of the second insulating film 73a and the thickness of the second insulating film 73b are smaller than the thickness of the fourth insulating film 72.

The second insulating film 73 and the fourth insulating film 72 insulate the second field plate electrode 74 and the second gate electrode 78 from the drift layer 12, the base region 14, and the source region 16.

The fifth insulating film 56 is provided on the first field plate electrode 54. For example, when the third insulating film 52 is provided so as to cover the first field plate electrode 54, the fifth insulating film 56 is provided on a part of the third insulating film 52. The fifth insulating film 56 is an insulating film formed by phosphosilicate glass (PSG), for example. In addition, the fifth insulating film 56 may not be provided.

The sixth insulating film 76 is provided on the second field plate electrode 74. For example, when the fourth insulating film 72 is provided so as to cover the second field plate electrode 74, the sixth insulating film 76 is provided on a part of the fourth insulating film 72. The sixth insulating film 76 is, for example, an insulating film formed by phosphosilicate glass (PSG). In addition, the sixth insulating film 76 may not be provided.

The first gate electrode 58 is provided on the fifth insulating film 56. The first gate electrode 58 is an electrode that functions as a gate of the MOSFET.

The second gate electrode 78 is provided on the sixth insulating film 76. The second gate electrode 78 is an electrode that functions as a gate of the MOSFET.

The interlayer insulating portion 60a is provided on the first gate electrode 58. The interlayer insulating portion 60b is provided on the second gate electrode 78.

The interlayer insulating portion 60 is provided to insulate the first gate electrode 58 and the second gate electrode 78 from the embedded electrode 42, the barrier metal 32, and the contact electrode 30.

The embedded electrodes 42d and 42a are provided so as to reach the base region 14a from above the source region 16a. The embedded electrodes 42e and 42b are provided so as to reach the base region 14b from above the source region 16c. The embedded electrodes 42f and 42c are provided so as to reach the base region 14c from above the source region 16d. The embedded electrode 42g is provided on the embedded electrode 42d, above the interlayer insulating portion 60a, on the embedded electrode 42e, above the interlayer insulating portion 60b, and on the embedded electrode 42f. The embedded electrodes 42a, 42b, 42c, 42d, 42e, 42f, and 42g are integrally formed, for example. The embedded electrode 42 is an electrode that functions as a source of the MOSFET.

The contact electrode 30a is provided between the embedded electrode 42b and the base region 14b. The contact electrode 30b is provided between the embedded electrode 42b and the source region 16b and between the embedded electrode 42b and the base region 14b. The contact electrode 30c is provided between the embedded electrode 42b and the source region 16c and between the embedded electrode 42b and the base region 14b. The contact electrode 30d is provided between the embedded electrode 42e and the source region 16b. The contact electrode 30e is provided between the embedded electrode 42e and the source region 16c. The contact electrode 30f is provided between the interlayer insulating portion 60a and the embedded electrode 42e. The contact electrode 30g is provided between the interlayer insulating portion 60b and the embedded electrode 42e. The contact electrode 30h is provided between the interlayer insulating portion 60a and the embedded electrode 42g. The contact electrode 30i is provided between the interlayer insulating portion 60b and the embedded electrode 42g. The contact electrode 30 is provided to reduce the contact resistance between the embedded electrode 42 and the base region 14 and the source region 16 by forming a silicide portion, which will be described later, between the contact electrode 30 and the $p^+$ region 24b and between the contact electrode 30 and the source region 16.

The film thickness a of the contact electrode 30a in the Z direction is smaller than the film thickness ID' of the contact electrode 30b in the Y direction and the film thickness $b_2$ of the contact electrode 30c in the Y direction. In addition, the film thickness $f_1$ of the contact electrode 30h in the Z direction is smaller than the film thickness $e_1$ of the contact electrode 30f in the Y direction. In addition, the film thickness $f_2$ of the contact electrode 30i in the Z direction is smaller than the film thickness $e_2$ of the contact electrode 30g in the Y direction.

In addition, the contact electrode 30 is similarly provided between the embedded electrodes 42a and 42d, and the base region 14a, the source region 16a, and the interlayer insulating portion 60a. In addition, the contact electrode 30 is similarly provided between the embedded electrodes 42c and 42f, and the base region 14c, the source region 16d, and the interlayer insulating portion 60b.

The source metal 44 is provided on the embedded electrode 42 and is electrically connected to the embedded electrode 42. The source metal 44 is used to connect an external electric circuit (not shown) to the source of the MOSFET.

The barrier metal 32 is provided between the embedded electrode 42 and the contact electrode 30. The barrier metal 32 is provided to suppress the diffusion of elements between the embedded electrode 42 and the contact electrode 30.

The $p^+$ region 24b is provided in the base region 14b below the contact electrode 30a. The p-type impurity concentration in the $p^+$ region 24b is higher than the p-type impurity concentration in the base region 14b. Similarly, the $p^+$ region 24a is provided in the base region 14a, and the $p^+$ region 24c is provided in the base region 14c.

The first silicide portion 26 is provided between the contact electrode 30a and the $p^+$ region 24b. The second silicide portion 28a is provided between the contact electrode 30b and the source region 16b. For example, the film thickness c of the first silicide portion 26 in the Z direction is equal to the film thickness d of the second silicide portion 28a in the Y direction. In addition, the film thickness c of the first silicide portion 26c in the Z direction may be different from the film thickness d of the second silicide portion 28a in the Y direction.

In addition, a silicide portion (not shown) may be provided between the contact electrode 30b and 30c, and the base region 14b. Similarly, a silicide portion is provided between the contact electrode 30 and the $p^+$ region 24a and 24c, and between the contact electrode 30 and the source region 16a and 16d.

In addition, when the silicidation reaction proceeds, it is conceivable that the entire contact electrode 30a becomes the first silicide portion 26, in other words, the film thickness a of the contact electrode 30a in the Z direction becomes zero. In this case, the first silicide portion 26 comes into direct contact with the barrier metal 32. In this case, the barrier metal 32 is provided between the base region 14b and the embedded electrode 42b in the Z direction. In addition, in the Z direction, the $p^+$ region 24b is provided between the barrier metal 32 and the base region 14b. In addition, the first silicide portion 26 is provided between the barrier metal 32 and the $p^+$ region 24b.

FIGS. 3A and 3B are schematic cross-sectional views of a main part of the semiconductor device 100 of the present embodiment. FIG. 3A is a schematic cross-sectional view of the semiconductor device 100 in the XZ plane. FIG. 3B is a schematic cross-sectional view of the semiconductor device 100 in the AA' cross section and the DD' cross section (FIG. 3A). In addition, the contact electrode 30 and the barrier metal 32 are not shown.

The first field plate electrode 54 has an upwardly extending portion 55. Then, the first field plate electrode 54 is electrically connected to a part of the embedded electrode 42 by using the upwardly extending portion 55. As a result, the first field plate electrode 54 is electrically connected to the source metal 44. The electrical connection between the second field plate electrode 74 and the source metal 44 is also made in the same manner. In addition, the form of the electrical connection between the first field plate electrode 54 and the second field plate electrode 74 and the source metal 44 is not limited to this.

The first gate electrode 58 is electrically connected to the embedded electrode 43. Then, a gate metal 46 is provided on the embedded electrode 43 and is electrically connected to the embedded electrode 43. As a result, the first gate electrode 58 is electrically connected to the gate metal 46. The gate metal 46 is used to connect an external electric circuit (not shown) to the gate of the MOSFET. The electrical connection between the second gate electrode 78 and the gate metal 46 is also made in the same manner. In addition, the form of the electrical connection between the first gate electrode 58 and the second gate electrode 78 and the gate metal 46 is not limited to this.

Figure 4:
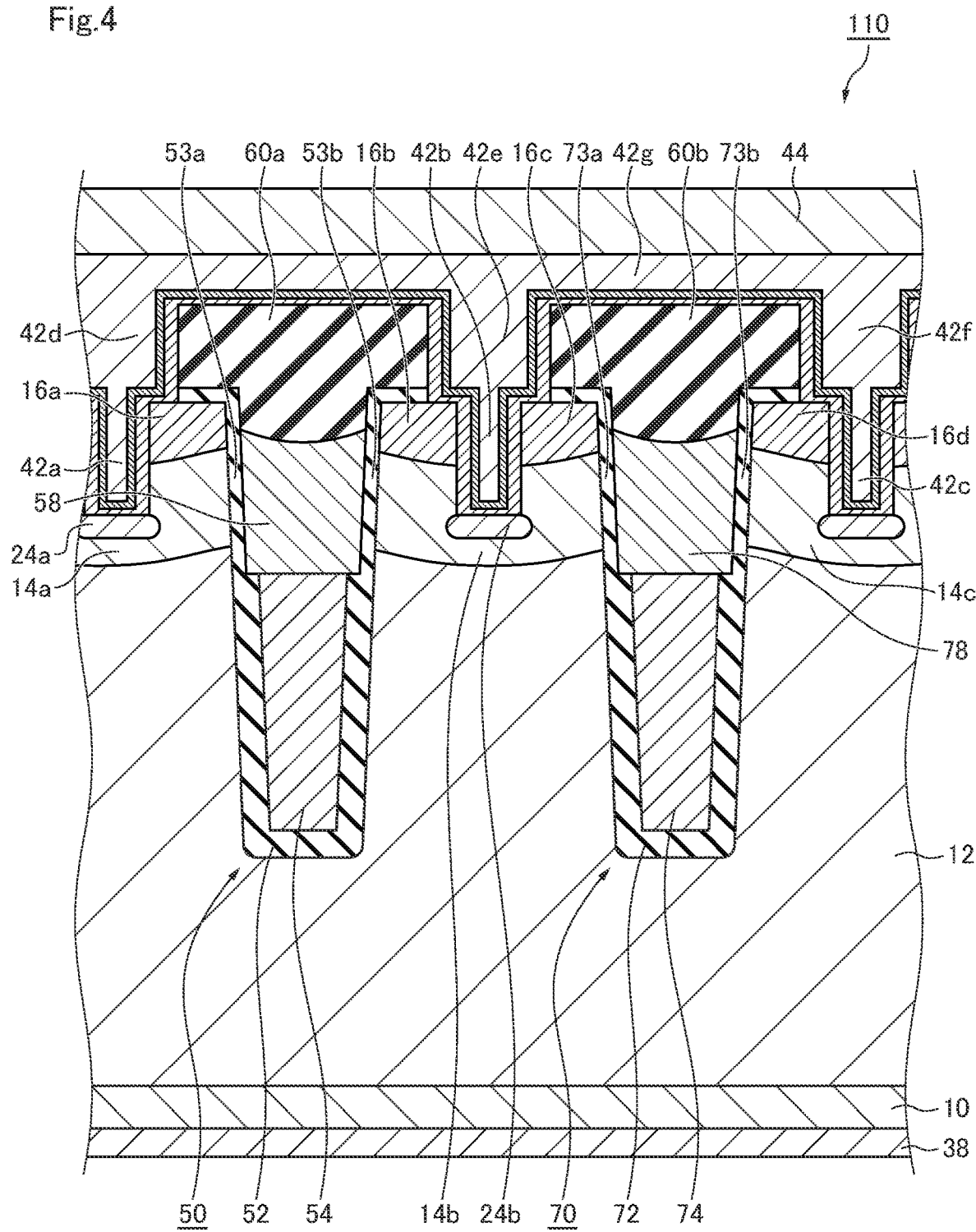
FIG. 4 is a schematic cross-sectional view of another aspect of the semiconductor device of the first embodiment.

FIG. 4 is a schematic cross-sectional view of another aspect of the semiconductor device of the present embodiment. FIG. 4 is a schematic cross-sectional view of a semiconductor device 110. In the semiconductor device 110, the fifth insulating film 56 and the sixth insulating film 76 are not provided. The first field plate electrode 54 is in contact with the first gate electrode 58. Therefore, the first field plate electrode 54 is electrically connected to the first gate electrode 58. Then, since the first gate electrode 58 is electrically connected to the gate metal 46, the first field plate electrode 54 is electrically connected to the gate metal 46. In addition, the electrical connection between the second field plate electrode 74 and the gate metal 46 is also made in the same manner.

As described above, the first field plate electrode 54 and the second field plate electrode 74 may be electrically connected to the gate metal 46.

The semiconductor material used for the drain layer 10, the drift layer 12, the base region 14, the source region 16, and the $p^+$ region 24 is, for example, silicon (Si).

When silicon is used as a semiconductor material, for example, arsenic (As), phosphorus (P), or antimony (Sb) can be used as an n-type impurity, and B (boron) can be used as a p-type impurity.

The first gate electrode 58, the second gate electrode 78, the first field plate electrode 54, and the second field plate electrode 74 contain a conductive material, such as polysilicon containing impurities.

The first insulating film 53, the second insulating film 73, the third insulating film 52, the fourth insulating film 72, the fifth insulating film 56, the sixth insulating film 76, and the interlayer insulating portion 60 contain an insulating material, such as silicon oxide or silicon nitride (SiN).

The drain electrode 38 contains a metal, such as aluminum (Al).

The embedded electrode 42 contains a first conductive material. Here, examples of the first conductive material include tungsten (W) or aluminum (Al). However, the first conductive material is not limited to these.

The contact electrode 30 contains a second conductive material. Here, examples of the second conductive material include titanium (Ti) or tungsten (W). However, the second conductive material is not limited to these.

The barrier metal 32 contains a third conductive material. Here, examples of the third conductive material include titanium nitride (TiN), cobalt (Co), or nickel (Ni). However, the third conductive material is not limited to these.

The source metal 44 and the gate metal 46 contain, for example, Al.

The first silicide portion 26 and the second silicide portion 28 contain silicide.

Figure 5:
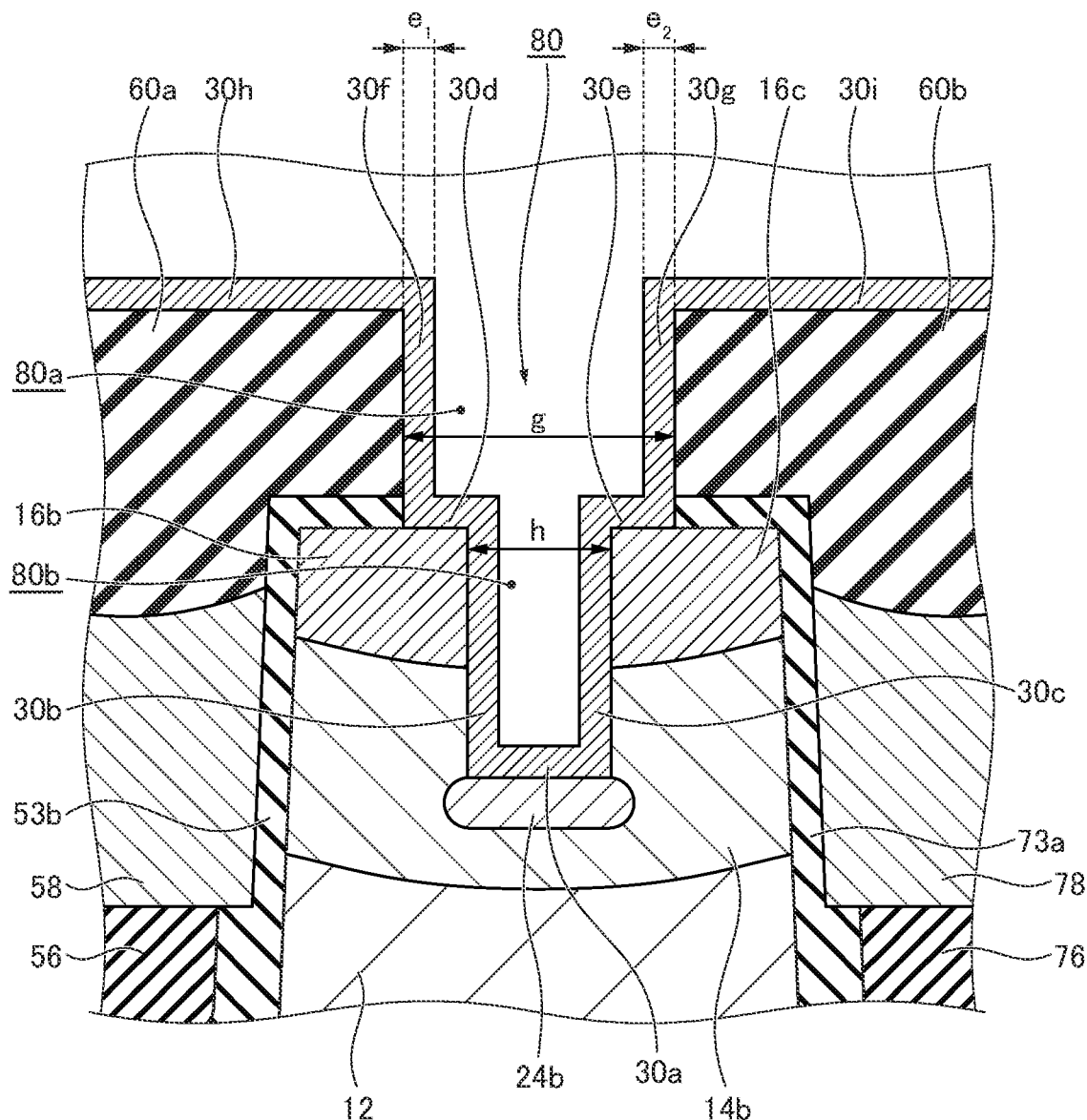
FIG. 5 is a schematic cross-sectional view showing a part of a process of manufacturing the semiconductor device of the first embodiment.
Figure 6:
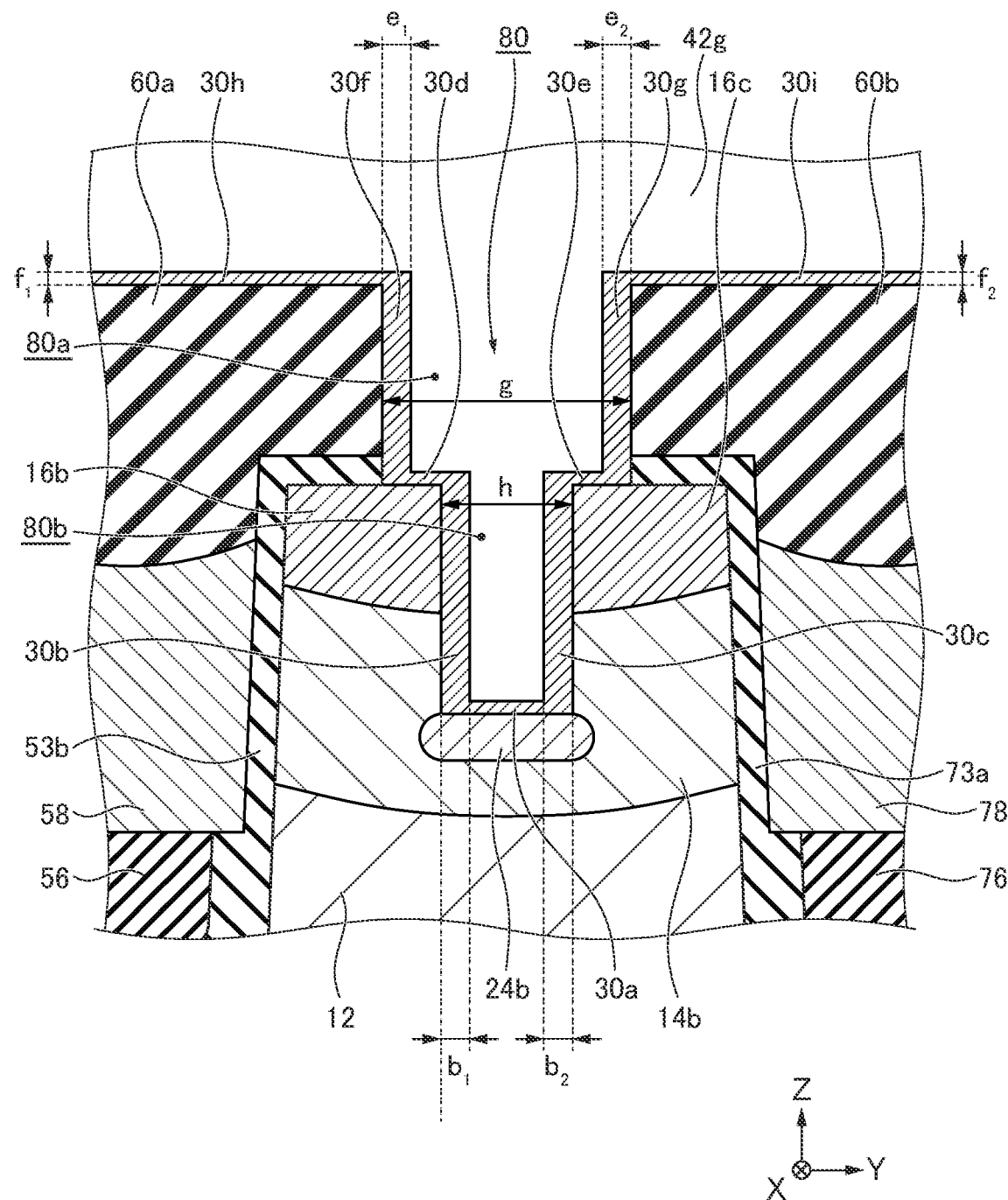
FIG. 6 is a schematic cross-sectional view showing a part of the process of manufacturing the semiconductor device of the first embodiment.

FIGS. 5 and 6 are schematic cross-sectional views showing a part of the process of manufacturing the semiconductor device of the present embodiment.

First, the drain electrode 38, the drain layer 10, the drift layer 12, the base region 14, the source region 16, the p$^+$ region 24, the first trench 50, the third insulating film 52, the first insulating film 53, and the first field plate electrode 54, the fifth insulating film 56, the first gate electrode 58, the interlayer insulating portion 60, the second trench 70, the fourth insulating film 72, the second insulating film 73, the second field plate electrode 74, the sixth insulating film 76, and the second gate electrode 78 are formed. Then, a trench 80 that reaches the base region 14 from above the interlayer insulating portion 60 is formed. Here, the trench 80 has a trench 80a having a width g and a trench 80b, which is provided below the trench 80a and has a width h smaller than the width g. However, a trench having a single width may reach the base region 14.

Then, the contact electrode 30 containing Ti is formed on the upper surface of the interlayer insulating portion 60, the side surface and bottom surface of the trench 80a, and the side surface and bottom surface of the trench 80b by using, for example, a chemical vapor deposition (CVD) method (FIG. 5).

Then, the film thicknesses of the contact electrode 30a, the contact electrode 30d, the contact electrode 30e, the contact electrode 30h, and the contact electrode 30i are reduced by using, for example, a reverse sputtering method or an anisotropic etching method (FIG. 6).

Then, the barrier metal 32 is formed on the contact electrode 30 by using, for example, sputtering. At this time, the first silicide portion 26 and the second silicide portion 28 are formed. Then, the embedded electrode 42 and the source metal 44 are formed on the barrier metal 32 by using, for example, a CVD method or a physical vapor deposition (PVD) method, thereby obtaining the semiconductor device 100 of the present embodiment.

Next, the function and effect of the semiconductor device of the present embodiment will be described.

Figure 7:
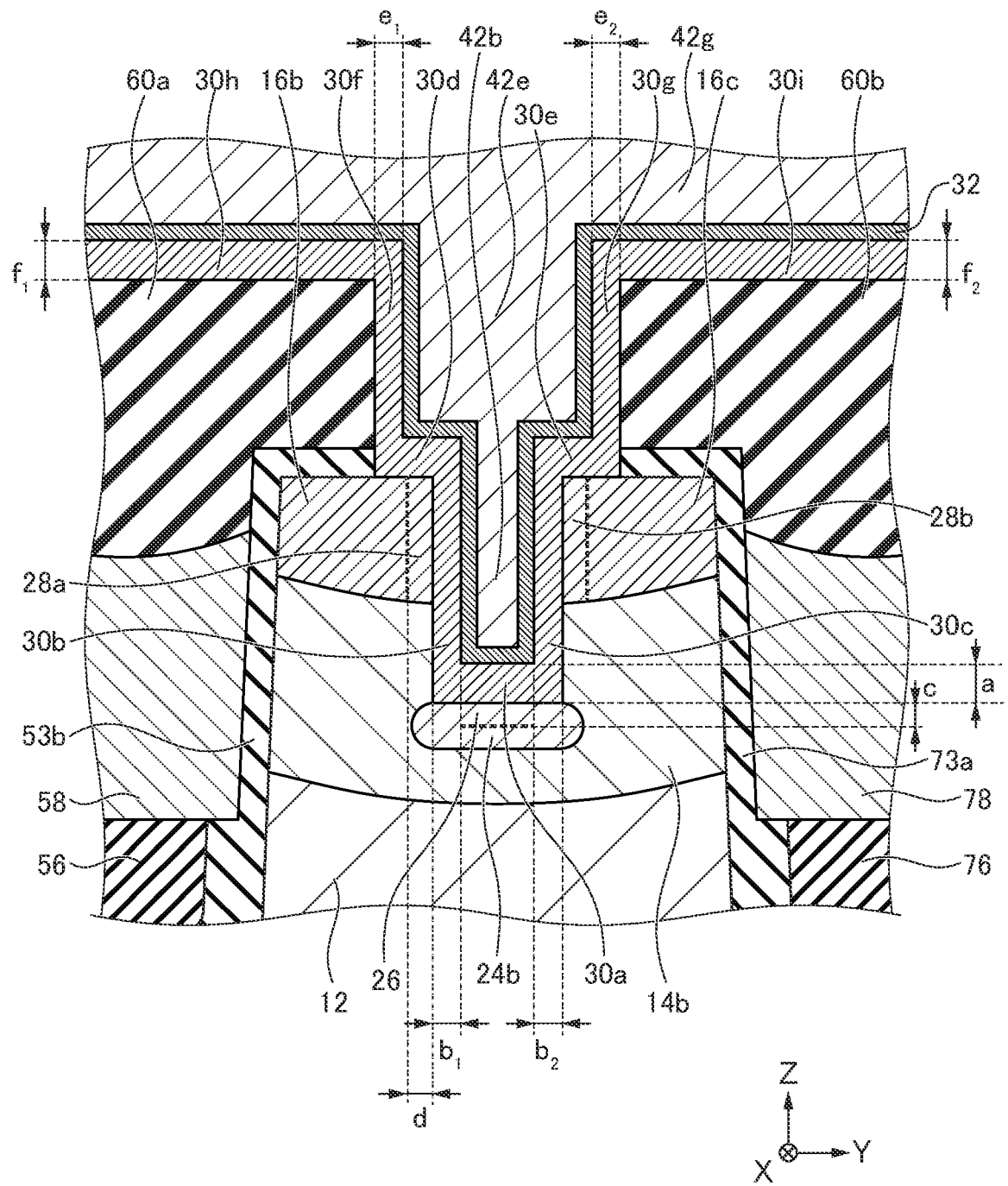
FIG. 7 is a schematic cross-sectional view of a semiconductor device according to a first comparative form of the first embodiment.

FIG. 7 is a schematic cross-sectional view of a semiconductor device according to a first comparative form of the present embodiment. The contact electrode 30 is formed by using, for example, a PVD method. In this case, the film thicknesses of the contact electrode 30a, the contact electrode 30d, the contact electrode 30e, the contact electrode 30h, and the contact electrode 30i in the Z direction are larger than the film thicknesses of the contact electrode 30b, the contact electrode 30c, the contact electrode 30f, and the contact electrode 30g in the Y direction.

Figure 8:
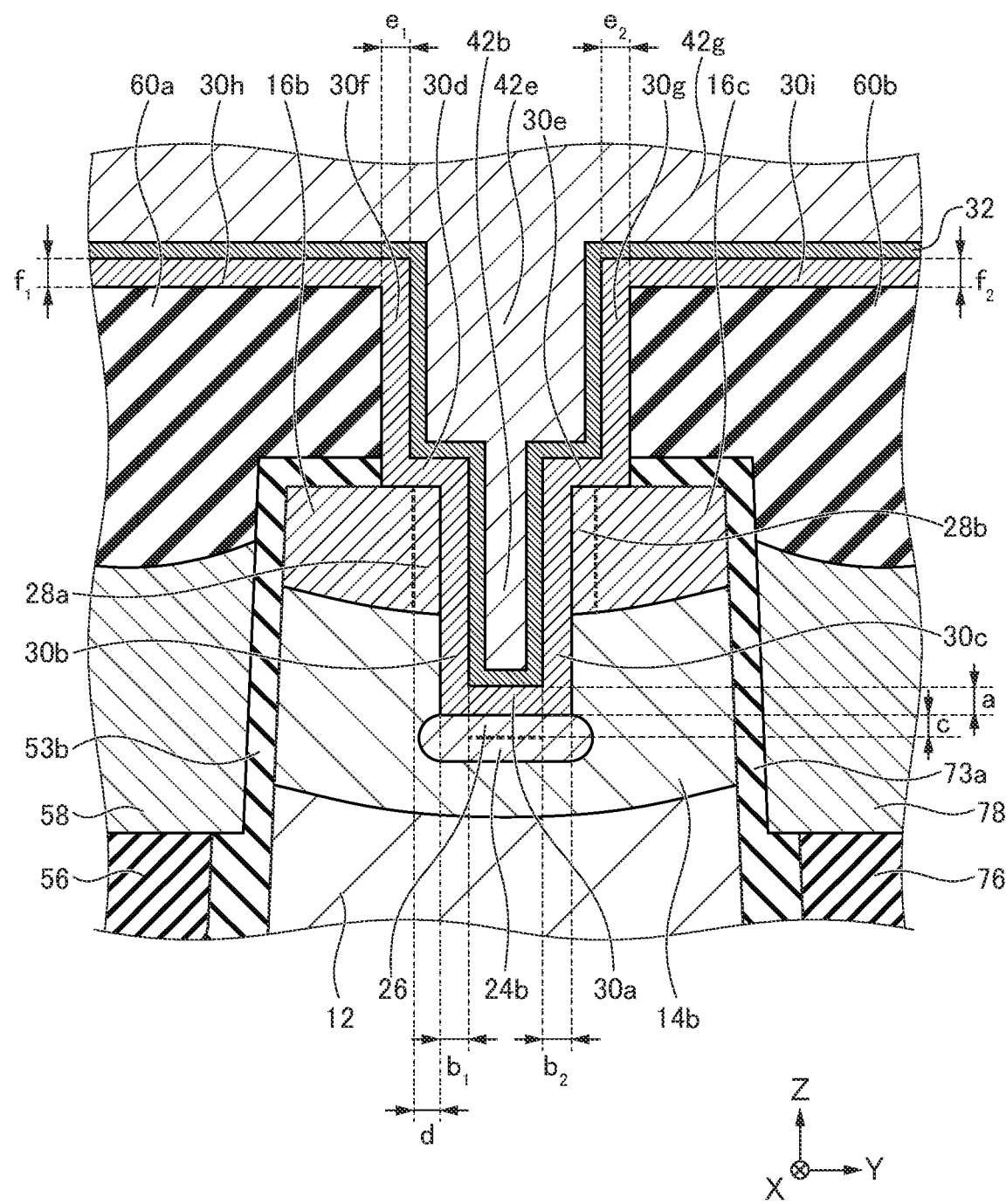
FIG. 8 is a schematic cross-sectional view of a semiconductor device according to a second comparative form of the first embodiment.

FIG. 8 is a schematic cross-sectional view of a semiconductor device according to a second comparative form of the present embodiment. The contact electrode 30 is formed by using, for example, a CVD method. In this case, the film thicknesses of the contact electrode 30a, the contact electrode 30d, the contact electrode 30e, the contact electrode 30h, and the contact electrode 30i in the Z direction are equal to the film thicknesses of the contact electrode 30b, the contact electrode 30c, the contact electrode 30f, and the contact electrode 30g in the Y direction.

Figure 9:
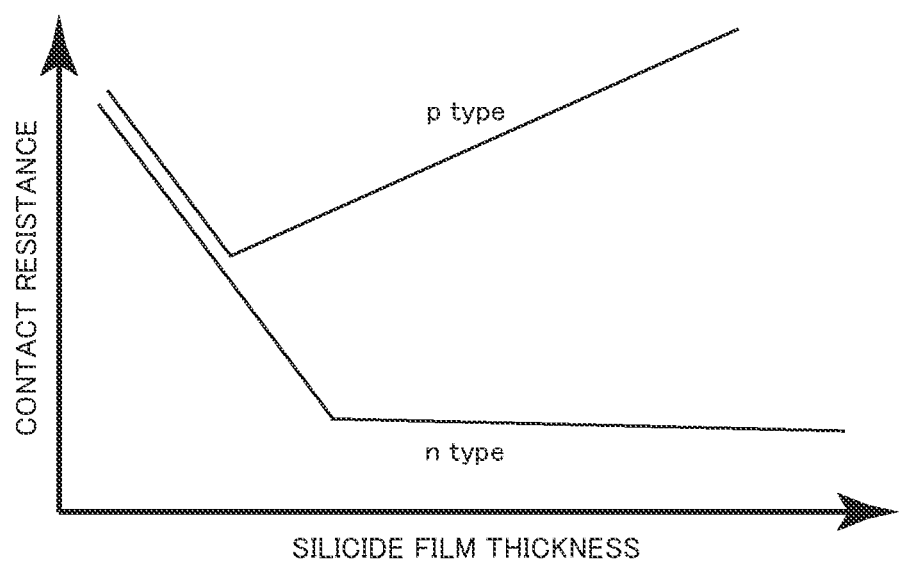
FIG. 9 is a schematic diagram for describing the function and effect of the semiconductor device of the first embodiment.

FIG. 9 is a schematic diagram for describing the function and effect of the semiconductor device 100 of the present embodiment. FIG. 9 schematically shows a graph in which the vertical axis shows the contact resistance between a semiconductor region in contact with silicide and the silicide and the horizontal axis shows the film thickness of the silicide. The first silicide portion 26 is formed between the p$^+$ region 24 and the contact electrode 30a. The first silicide portion 26 contains p-type impurities contained in the p$^+$ region 24. On the other hand, the second silicide portion 28 is formed between the source region 16b and the contact electrode 30b and between the source region 16c and the contact electrode 30c. The second silicide portion 28 contains n-type impurities contained in the source region 16.

The contact resistance between the second silicide portion 28 containing n-type impurities and the source region 16 decreases monotonically as the silicide film thickness increases. Therefore, it is preferable that the film thickness $b_1$ of the contact electrode 30b in the Y direction and the film thickness $b_2$ of the contact electrode 30c in the Y direction are large.

On the other hand, the contact resistance between the first silicide portion 26 containing p-type impurities and the p$^+$ region 24 decreases as the silicide film thickness increases. However, as the silicide film thickness further increases, the contact resistance between the first silicide portion 26 containing p-type impurities and the p$^+$ region 24 increases on the contrary. This is because, as the silicide film thickness becomes larger, a larger amount of p-type impurities move from the p$^+$ region 24 to the first silicide portion 26, so that the amount of p-type impurities in the p$^+$ region 24 near the first silicide portion 26 decreases. When the amount of p-type impurities decreases, there is a problem that the contact resistance between the p$^+$ region 24 and the embedded electrode 42 increases and the avalanche tolerance decreases.

In addition, in order to reduce the contact resistance between the first silicide portion 26 and the p$^+$ region 24, it can be considered to design the p$^+$ region 24 deep, in other words, increase the length of the p$^+$ region 24 in the Z direction. In this case, however, when a reverse voltage is applied to the semiconductor device 100, the tolerance of the snapback mode may decrease when avalanche breakdown occurs. In addition, in this case, since the diffusion length of p-type impurities in the Y direction increases, there is a problem that there is a disadvantage in scaling-down of the semiconductor device 100.

Therefore, in the semiconductor device 100 of the present embodiment, the film thickness a of the contact electrode 30a in the Z direction is smaller than the film thickness $b_1$ of the contact electrode 30b in the Y direction and the film thickness $b_2$ of the contact electrode 30c in the Y direction. By reducing the film thickness of the contact electrode 30a, it is possible to suppress a significant increase in the film thickness of the first silicide portion 26. For this reason, it is preferable that the film thickness of the contact electrode 30a is small in order to suppress an extreme increase in contact resistance.

From the above, it is preferable that the film thickness a of the contact electrode 30a in the Z direction is smaller than the film thickness $b_1$ of the contact electrode 30b in the Y direction and the film thickness $b_2$ of the contact electrode 30c in the Y direction.

In addition, when the manufacturing is performed so that the film thickness a of the contact electrode 30a in the Z direction is smaller than the film thickness ID' of the contact electrode 30b in the Y direction and the film thickness $b_2$ of the contact electrode 30c in the Y direction, the film thickness $f_1$ of the contact electrode 30h in the Z direction is smaller than the film thickness $e_1$ of the contact electrode 30*f* in the Y direction as shown in FIG. 6. In addition, the film thickness $f_2$ of the contact electrode 30*i* in the Z direction is smaller than the film thickness $e_2$ of the contact electrode 30*g* in the Y direction.

According to the semiconductor device of the present embodiment, it is possible to provide a semiconductor device in which both a reduction in on-resistance and an improvement in avalanche tolerance are realized.

Second Embodiment

A semiconductor device of the present embodiment is different from the semiconductor device of the first embodiment in that this is an insulated gate bipolar transistor (IGBT). Here, the description of the content overlapping the first embodiment will be omitted.

FIG. 10 is a schematic cross-sectional view of a semiconductor device 200 of the present embodiment.

A collector electrode (an example of the first electrode) 38 is an electrode that functions as a collector electrode of the IGBT.

A collector layer (an example of the second semiconductor layer) 8 is provided on the collector electrode 38 and is electrically connected to the collector electrode 38. The collector layer 8 is a layer that functions as a collector of the IGBT. The collector layer 8 contains, for example, a p$^+$-type semiconductor material.

The embedded electrode 42 functions as an emitter electrode of the IGBT.

FIG. 11 is a schematic cross-sectional view of another aspect of the semiconductor device of the present embodiment. FIG. 11 is a schematic cross-sectional view of a semiconductor device 210. In the semiconductor device 210, the fifth insulating film 56 and the sixth insulating film 76 are not provided. The first field plate electrode 54 is in contact with the first gate electrode 58. Therefore, the first field plate electrode 54 is electrically connected to the first gate electrode 58. Then, since the first gate electrode 58 is electrically connected to the gate metal 46, for example, as shown in FIG. 3A, the first field plate electrode 54 is electrically connected to the gate metal 46. In addition, the electrical connection between the second field plate electrode 74 and the gate metal 46 is also made in the same manner.

According to the semiconductor device of the present embodiment, it is also possible to provide a semiconductor device in which both a reduction in on-resistance and an improvement in avalanche tolerance are realized.

While certain embodiments have been described, these embodiments have been presented by way of example only, and are not intended to limit the scope of the inventions. Indeed, the semiconductor device described herein may be embodied in a variety of other forms; furthermore, various omissions, substitutions and changes in the form of the devices and methods described herein may be made without departing from the spirit of the inventions. The accompanying claims and their equivalents are intended to cover such forms or modifications as would fall within the scope and spirit of the inventions.

What is claimed is:

1. A semiconductor device, comprising:
a first electrode;
a first semiconductor layer of a first conductivity type provided on the first electrode;
a first semiconductor region of a second conductivity type provided on the first semiconductor layer;
a second semiconductor region of the first conductivity type provided on the first semiconductor region;
a second electrode provided in a first trench, the second electrode facing the first semiconductor region with a first insulating film interposed between the second electrode and the first semiconductor region and the first trench reaching the first semiconductor layer from above the first semiconductor region;
a third electrode provided in a second trench, the third electrode facing the first semiconductor region with a second insulating film interposed between the third electrode and the first semiconductor region and the second trench reaching the first semiconductor layer from above the first semiconductor region;
a fourth electrode reaching the first semiconductor region from above the second semiconductor region, the fourth electrode being provided between the first trench and the second trench and between the second electrode and the third electrode and the fourth electrode containing a first conductive material;
an interlayer insulating portion provided on the second electrode,
a fifth electrode including a first portion, a second portion, a third portion, a fourth portion, and a fifth portion,
the first portion provided between the fourth electrode and the first semiconductor region in a first direction in which the first electrode and the first semiconductor layer are stacked and extending in parallel to a second direction that is perpendicular to the first direction,
the second portion provided between the fourth electrode and the first semiconductor region in the second direction and extending in parallel to the first direction,
the third portion provided between the fourth electrode and the second semiconductor region in the second direction and extending in parallel to the first direction,
the fourth portion provided on a side surface of the interlayer insulating portion,
the fifth portion provided on an upper surface of the interlayer insulating portion,
the fifth electrode containing a second conductive material,
a film thickness of the first portion in the first direction being smaller than a film thickness of the second portion in the second direction and a film thickness of the third portion in the second direction,
a film thickness of the fourth portion in the second direction being larger than a film thickness of the fifth portion in the first direction;
a sixth electrode provided between the fourth electrode and the fifth electrode and the sixth electrode containing a third conductive material; and
a third semiconductor region provided between the fifth electrode and the first semiconductor region in the first direction and the third semiconductor region having a higher concentration of impurities of the second conductivity type than the first semiconductor region.

2. The semiconductor device according to claim 1, further comprising:
a seventh electrode provided between the fifth electrode and the third semiconductor region and the seventh electrode containing silicide; and
an eighth electrode provided between the fifth electrode and the second semiconductor region and the eighth electrode containing silicide.

3. The semiconductor device according to claim 1, wherein the first conductive material contains tungsten (W) or aluminum (Al).

4. The semiconductor device according to claim 1, wherein the second conductive material contains titanium (Ti) or tungsten (W).

5. The semiconductor device according to claim 1, wherein the third conductive material contains titanium nitride (TiN), cobalt (Co) or nickel (Ni).

6. The semiconductor device according to claim 1, further comprising:
a second semiconductor layer of the second conductivity type provided between the first electrode and the first semiconductor layer.

7. The semiconductor device according to claim 1, further comprising:
a third semiconductor layer provided between the first electrode and the first semiconductor layer and the third semiconductor layer having a higher concentration of impurities of the first conductivity type than the first semiconductor layer.

* * * * *